(12) United States Patent
Lee et al.

(10) Patent No.: US 6,724,632 B2
(45) Date of Patent: Apr. 20, 2004

(54) HEAT SINK ASSEMBLY WITH ADJUSTABLE CLIP

(75) Inventors: Hsieh-Kun Lee, Tu-Chen (TW); Dong-Yun Lee, Shenzhen (CN); Zhi-Jie Zhang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 96 days.

(21) Appl. No.: 10/300,232

(22) Filed: Nov. 19, 2002

(65) Prior Publication Data

US 2004/0012927 A1 Jan. 22, 2004

(30) Foreign Application Priority Data

Jul. 18, 2002 (TW) ...................................... 91210913 U

(51) Int. Cl.$^7$ ................................................ H05K 7/20
(52) U.S. Cl. ........................... 361/719; 24/457; 24/458; 165/80.3; 165/185; 248/505; 248/510; 257/719; 361/704; 361/707; 361/710
(58) Field of Search .................... 24/295–296, 457–458; 248/457–458; 165/80.2, 80.3, 185; 257/718–719, 767–727; 361/704, 707, 709, 710, 719, 720

(56) References Cited

U.S. PATENT DOCUMENTS

| | | | |
|---|---|---|---|
| 5,662,163 A | * 9/1997 | Mira | .......................... 361/719 |
| 5,664,624 A | 9/1997 | Tsai et al. | |
| 5,770,891 A | * 6/1998 | Frankeny et al. | ........... 257/727 |
| 5,784,257 A | 7/1998 | Tata | |
| 5,932,925 A | * 8/1999 | Mcintyre | ..................... 257/719 |
| 5,943,210 A | * 8/1999 | Lee et al. | .................... 361/697 |
| 5,982,622 A | 11/1999 | Chiou | |
| 6,141,220 A | 10/2000 | Lin | |
| 6,282,093 B1 | * 8/2001 | Goodwin | ..................... 361/704 |
| 6,462,945 B2 | * 10/2002 | Sloan et al. | ................. 361/704 |

* cited by examiner

*Primary Examiner*—Gregory Thompson
(74) *Attorney, Agent, or Firm*—Wei Te Chung

(57) ABSTRACT

A heat sink assembly includes a back plate (10), a clip (20) and a heat sink (50). The back plate is attached below a motherboard (60) on which a CPU (63) is mounted. The heat sink is attached on the CPU. Two posts (13) of the back plate extend through the motherboard and the heat sink. The heat sink includes a base (51) and fins (55). A longitudinal channel (57) is transversely defined through the fins. The base defines a recess (53) under the channel fittingly receiving an annular disc (58) therein. The clip includes a pressing portion (22) received in the channel, and two locking portions (29) engaging with the corresponding posts. A bolt (40) is screwed through the pressing portion to abut against the disc. By adjusting a depth to which the bolt is screwed, the clip can provide adjustable pressure acting on the heat sink.

21 Claims, 3 Drawing Sheets

HEAT SINK ASSEMBLY WITH ADJUSTABLE CLIP

BACKGROUND OF THE INVENTION

1. Field of the Invention

The present invention relates to heat sink assemblies, and particularly to heat sink assemblies with adjustable clips which can provide adjustable pressure acting on heat sinks.

2. Related Art

Computer electronic devices such as central processing units (CPUs) frequently generate large amounts of heat, which can destabilize operation and cause damage. A heat sink placed in thermal contact with an electronic device transfers heat from the electronic device through conduction. Modem heat sinks are being made larger and heavier. Therefore, a back plate is often attached on an underside of a motherboard below an electronic device mounted on the motherboard. The back plate reinforces the motherboard.

U.S. Pat. No. 6,141,220 discloses a heat sink assembly comprising a mother board, a back plate attached below the mother board, a heat sink attached on the mother board, and a pair of clips. The back plate comprises four upright mounting rods. Each of the rods has a narrowed neck. Each clip has a pair of spring strips extending obliquely upwardly. Each spring strip defines a slot. The rods sequentially extend through holes defined in the motherboard and the heat sink to engage in the slots of the corresponding spring strips. Each clip is integrally made from a sheet of metallic material. Therefore the fixing force of the clips cannot be adjusted to fit heat sinks of varying sizes and weights. Accordingly, the clips are not easily interchangeable for use in various applications.

SUMMARY OF THE INVENTION

Accordingly, an object of the present invention is to provide a heat sink assembly having a clip which can provide adjustable pressure acting on a heat sink.

To achieve the above-mentioned object, a heat sink assembly in accordance with the present invention comprises a heat sink, a back plate, and a clip. The heat sink is attached on a CPU, which itself is mounted on a motherboard. The back plate is attached below the motherboard. A pair of posts of the back plate extends through the motherboard and the heat sink. The heat sink includes a base and a plurality of fins. A longitudinal channel is transversely defined through a middle of the fins. The base defines a recess below and in communication with the channel. An annular disc having a recessed portion is fittingly received in the recess. The clip includes a pressing portion received in the channel, and a pair of locking portions engaging with the corresponding posts. A bolt is screwed through the pressing portion to abut against the recessed portion of the disc. By adjusting a depth to which the bolt is screwed through the pressing portion, the clip can provide adjustable pressure acting on the heat sink. Thus the heat sink can firmly contact the CPU with minimal risk of damage being caused by excessive pressure.

Other objects, advantages and novel features of the present invention will be drawn from the following detailed description of a preferred embodiment of the present invention with attached drawings, in which:

DESCRIPTION OF THE PREFERRED EMBODIMENT

Figure 1:
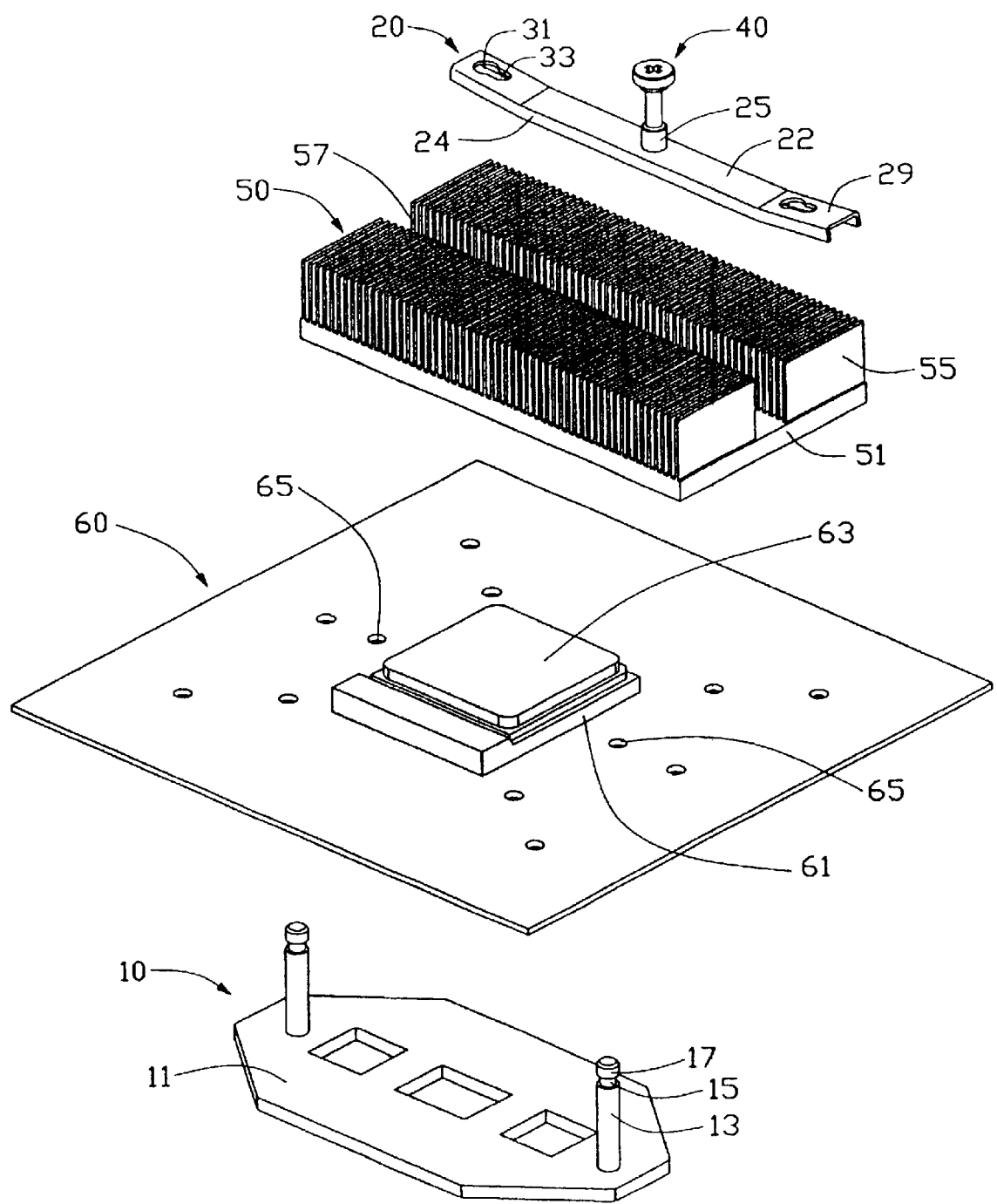
FIG. 1 is an exploded isometric view of a heat sink assembly in accordance with the present invention, together with a motherboard, and a CPU socket with a CPU mounted on the motherboard.

FIG. 1 of the attached drawings shows a heat sink assembly in accordance with the present invention, together with a motherboard 60, a central processing unit (CPU) socket 61 and a CPU 63. The socket 61 is mounted on the motherboard 60. The CPU 63 is attached on the socket 61. The motherboard 60 defines a pair of through apertures 65 on opposite sides of the socket 61 respectively.

The heat sink assembly comprises a back plate (or reinforcement plate) 10, a clip 20, a bolt 40 which may also function as the manual manipulation device during lengthwise moving the clip 20, and a heat sink 50. The back plate 10 comprises a body 11, and a pair of posts 13 extending upwardly from the body 11. Each post 13 comprises a head 17 at a top end thereof, and a narrowed neck 15 below the head 17. The clip 20 comprises an elongate pressing portion 22, and a pair of locking portions 29 extending from opposite ends of the pressing portion 22 respectively. A pair of elongate flanges 24 depends from opposite side edges of the clip 20 respectively, for reinforcing the clip 20. A hollow cylinder 25 protrudes upwardly from a center of the pressing portion 22. The hollow cylinder 25 has an inner thread for engaging with the bolt 40. A through opening (not shown) is defined in the center of the pressing portion 22 in communication with the hollow cylinder 25. Each locking portion 29 defines a large cutout 31, and a small cutout 33 in communication with the large cutout 31. Each large cutout 31 is located on a left side of its adjacent small cutout 33.

Figure 2:
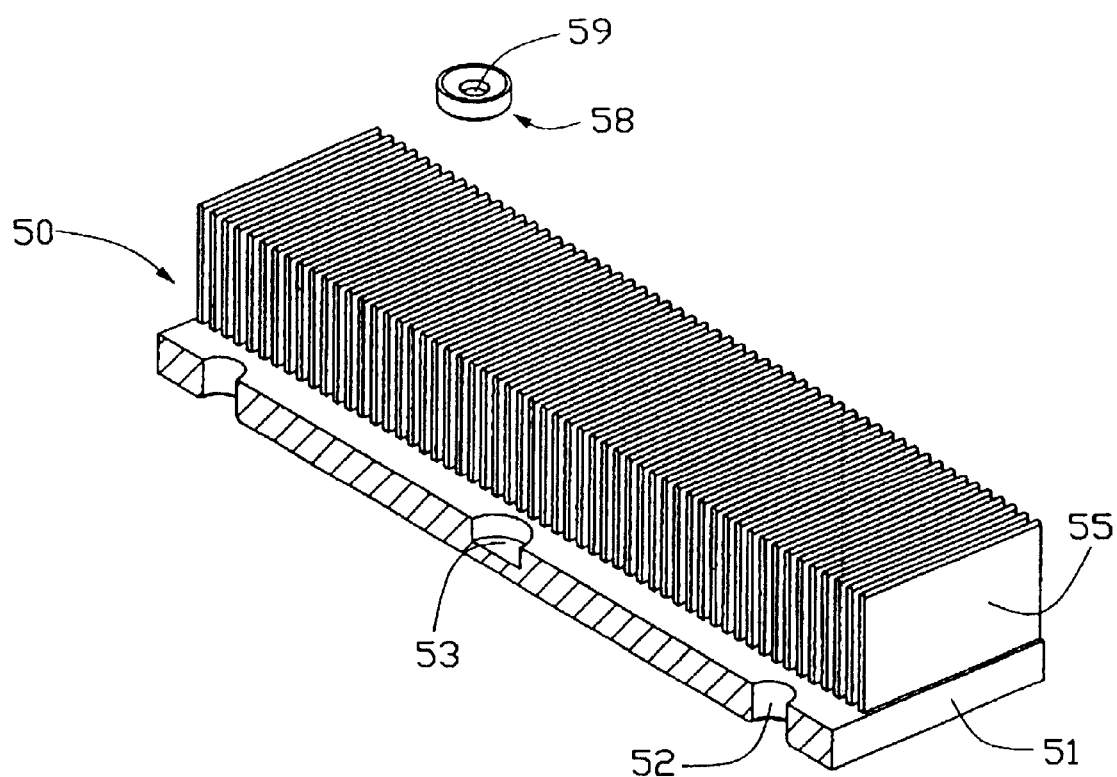
FIG. 2 is a cut-away isometric view of a heat sink of the heat sink assembly of FIG. 1, together with a pressing disc.

Referring also to FIG. 2, the heat sink 50 comprises a base 51 and a plurality of parallel fins 55 extending upwardly from the base 51. A longitudinal channel 57 is transversely defined through a middle of the fins 55. A pair of spaced through holes 52 is defined in the base 51, below and in communication with the channel 57. A recess 53 is defined in the base 51 between the through holes 52 and in communication with the channel 57. The recess 53 is for fittingly receiving an annular disc 57 therein. The annular disc 57 is made of stainless steel material, and comprises a central recessed portion 59.

Figure 3:
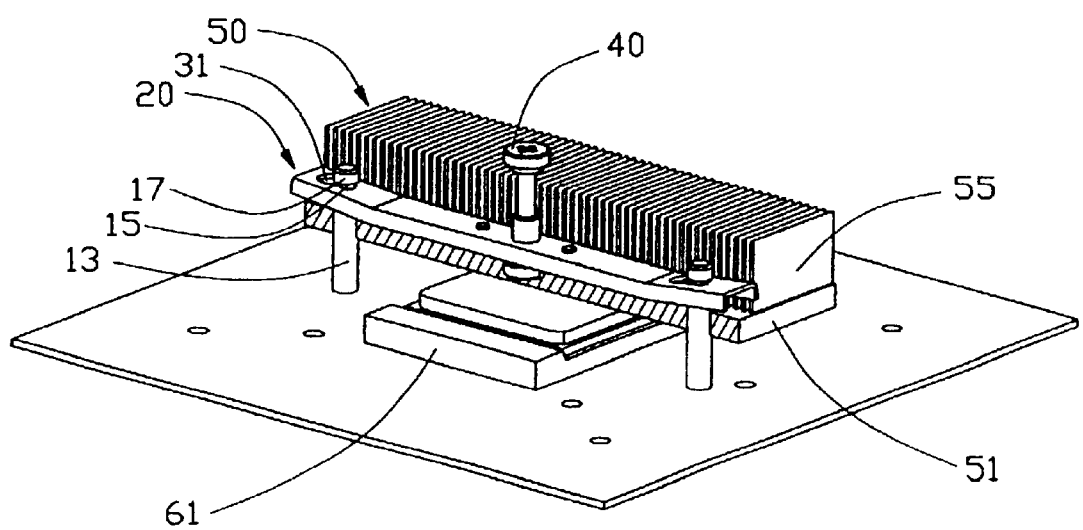
FIG. 3 is an assembled view of FIG. 1, but with part of the heat sink cut away for clearer illustration.

Referring also to FIG. 3, in assembly, the heat sink 50 is placed on the CPU 63. The through holes 52 of the heat sink 50 are aligned with the apertures 65 of the motherboard 60. The posts 13 of the back plate 10 are sequentially extended through the apertures 65 and the through holes 52 until the body 11 of the back plate 10 abuts the motherboard 60. The annular disc 58 is fittingly received in the recess 53 of the heat sink 50. The clip 20 is then placed in the channel 57 of the heat sink 50. The heads 17 of the posts 13 protrude up beyond the corresponding large cutouts 31 of the clip 20, and the necks 15 of the posts 13 are located in the large cutouts 31. The clip 20 is pushed to the left. The necks 15 are accordingly engaged in the corresponding small cutouts 33 of the clip 20. The bolt 40 is then screwed through the hollow cylinder 25 and the through opening of the clip 20 so that a distal end of the bolt 40 abuts against the recessed portion 59 of the annular disc 57. Thus the clip 20 securely attaches the heat sink 50 to the CPU 63. In addition, the clip 20 securely attaches the heat sink 50 to the motherboard 20 via the back plate 10.

In the present invention, when the bolt 40 is screwed downwardly, the distal end of the bolt 40 presses against the recessed portion 59, and simultaneously the pressing portion 22 of the clip 20 moves resiliently upwardly. The locking portions 29 of the clip 20 are accordingly moved upwardly, and pull the heads 17 of the posts 13 upwardly. The back plate 10 pushes the motherboard 60 upwardly until the CPU 63 firmly contacts the base 51 of the heat sink 50. By adjusting a depth to which the bolt 40 is screwed through the cylinder 25, the clip 20 can provide adjustable pressure acting on the heat sink 50. Thus the heat sink 50 can firmly contact the CPU 63 with minimal risk of damage being caused by excessive pressure. The recessed portion 59 of the disc 58 is for receiving scrap iron produced by the bolt 40, thereby preventing the scrap iron contacting the motherboard to generate short circuit.

It is understood that the invention may be embodied in other forms without departing from the spirit thereof. Thus, the present example and embodiment is to be considered in all respects as illustrative and not restrictive, and the invention is not to be limited to the details given herein. For example, other alternatives may be applied to the product shown in U.S. Pat. No. 5,982,622 wherein the rods extend from the bottom of the heat sink and the clip is located on the other side of the plate without involvement of reinforcement plate thereof, as long as the center portion of the clip is properly configured to be equipped with an adjustable knob.

What is claimed is:

1. A heat sink assembly for an electronic device mounted on a motherboard, comprising:
    a back plate adapted for being attached on an underside of the motherboard, the back plate comprising a plurality of posts adapted for extending through the motherboard, each of the posts having a narrowed neck;
    a heat sink adapted to be attached on the electronic device, the heat sink comprising a base and a plurality of fins;
    a clip pressing on the heat sink, the clip comprising a pressing portion and a pair of locking portions engaging with corresponding necks of the posts; plate; and
    a bolt adjustably received through the pressing portion to abut against the base, wherein the clip can provide adjustable pressure acting on the heat sink.

2. The heat sink assembly as claimed in claim 1, wherein when the bolt is adjusted downwardly and presses the base toward the electronic device, the pressing portion is simultaneously moved upwardly thereby pulling the posts upwardly whereby the electronic device firmly contacts the heat sink.

3. The heat sink assembly as claimed in claim 1, wherein each of the locking portions defines a large cutout and a small cutout in communication with the large cutout, the back plate comprises two posts, each of the posts further has a head above the neck, the head is extendable through a corresponding large cutout, and the neck is engagable in a corresponding small cutout.

4. The heat sink assembly as claimed in claim 1, wherein the pressing portion has a hollow cylinder arranged thereon, and the cylinder has an inner thread adjustably engaging with the bolt.

5. The heat sink assembly as claimed in claim 4, wherein the pressing portion defines a through opening below the cylinder for extension of the bolt therethrough.

6. The heat sink assembly as claimed in claim 1, wherein the heat sink defines a longitudinal channel transversely through the fins, and the clip is received in the channel with the pressing portion abutting the base.

7. The heat sink assembly as claimed in claim 1, wherein the back plate comprises two posts, and the base of the heat sink defines a pair of through holes for extension of the posts therethrough.

8. The heat sink assembly as claimed in claim 7, wherein the base defines a recess between the through holes, a disc is fittingly received in the recess, the disc comprises a recessed portion for receiving scrap iron produced by the bolt, and the bolt abuts against the recessed portion.

9. The heat sink assembly as claimed in claim 8, wherein the disc is made of stainless steel material.

10. The heat sink assembly as claimed in claim 1, wherein the clip further comprises a pair of flanges depending from opposite side edges thereof, for reinforcing the clip.

11. A method for securing a heat sink to a motherboard, the motherboard defining a plurality of through apertures, the method comprising the steps of:
    a) providing a back plate comprising a plurality of posts extending upwardly therefrom;
    b) providing a heat sink comprising a base and a plurality of fins arranged on the base, the base defining a plurality of through holes;
    c) providing a clip comprising a pressing portion and a pair of locking portions, each of the locking portions defining a large cutout and a small cutout;
    d) attaching the heat sink on the motherboard;
    e) attaching the back plate to an underside of the motherboard, with the posts extending through the through apertures and the through holes respectively; and
    f) placing the clip over top ends of the posts, with the posts protruding beyond the large cutouts respectively;
    g) pushing the clip horizontally until the posts engage in the small cutouts respectively; and
    h) screwing a bolt through the pressing portion of the clip to abut the base.

12. The method as claimed in claim 11, wherein the clip can provide adjustable pressure acting on the heat sink by adjusting an extent to which the bolt is screwed through the pressing portion.

13. The method as claimed in claim 11, wherein the pressing portion has a hollow cylinder arranged thereon, and the cylinder has an inner thread for engaging with the bolt.

14. The method as claimed in claim 11, wherein the pressing portion defines a through opening below the cylinder for extension of the bolt therethrough.

15. The method as claimed in claim 11, wherein each of the posts comprises a head, a body, and a narrowed neck between the head and the body for engaging with a corresponding locking portion in a corresponding small cutout.

16. A heat sink assembly comprising:
    a board;
    an electronic device located on one side of the board without lateral movement;
    a heat sink seated upon the electronic device;
    a pair of rods each having a wide head and a narrow neck horizontally immoveable relative to the board; and
    a clip including a central portion and two locking portions at two elongated ends, each of said locking portions defining large and small sections to allow the wide head of the corresponding rods to extend through the large section in an initial relative vertical movement and engage the small section in a successive relative lengthwise movement; wherein an adjustable knob is provided on the central portion, which is able to increase a relative distance between the central portion and heat sink along an axial direction of the adjustable knob to have the clip and the heat sink in a tension manner for securing the heat sink to the board and assuring tight abutment between the heat sink and the electronic device.

17. The assembly as claimed in claim 16, wherein said adjustable knob also functions as a manual manipulation device during movement of the clip.

18. The assembly as claimed in claim 16, wherein the two locking portions extend obliquely relative to the central portion.

19. The assembly as claimed in claim 16, wherein said pair of rods extend from a reinforcement plate, which is located on the other side of the board, and through said board and exposed to an exterior.

20. The assembly as claimed in claim 19, wherein said pair of rods further extend through the heat sink for restricting horizontal movement of the heat sink relative to the board.

21. The assembly as claimed in claim 16, wherein the heat sink is equipped with a disk to receive a distal end of the adjustable knob.

* * * * *